(12) United States Patent
Nystrom et al.

(10) Patent No.: US 7,196,536 B2
(45) Date of Patent: Mar. 27, 2007

(54) METHOD AND APPARATUS FOR NON-CONTACT ELECTRICAL PROBE

(75) Inventors: Michael J. Nystrom, San Jose, CA (US); Gloria E. Hofler, Sunnyvale, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 10/910,060

(22) Filed: Aug. 2, 2004

(65) Prior Publication Data
US 2006/0022696 A1    Feb. 2, 2006

(51) Int. Cl.
*G01R 31/00* (2006.01)
*G01R 31/26* (2006.01)
*G01R 31/28* (2006.01)

(52) U.S. Cl. .................. 324/765; 324/158.1; 324/770; 438/17; 250/492.2

(58) Field of Classification Search ............... 324/765, 324/752, 753, 751, 754, 769, 158.1; 438/17, 438/14, 197
See application file for complete search history.

(56) References Cited

U.S. PATENT DOCUMENTS

| | | | | |
|---|---|---|---|---|
| 3,932,877 | A | * | 1/1976 | Ohnishi ...................... 347/140 |
| 4,812,756 | A | * | 3/1989 | Curtis et al. ................ 324/750 |
| 4,891,584 | A | * | 1/1990 | Kamieniecki et al. ...... 324/752 |
| 5,091,691 | A | * | 2/1992 | Kamieniecki et al. ...... 324/765 |
| 5,485,091 | A | * | 1/1996 | Verkuil ....................... 324/455 |
| 5,719,406 | A | * | 2/1998 | Cisneros et al. ............. 257/10 |
| 6,391,668 | B1 | * | 5/2002 | Chacon et al. ............... 438/17 |
| 6,734,696 | B2 | * | 5/2004 | Horner et al. .............. 324/765 |
| 6,815,974 | B1 | * | 11/2004 | Lagowski et al. .......... 324/766 |
| 6,859,052 | B1 | * | 2/2005 | Vaucher ...................... 324/751 |
| 6,998,611 | B2 | * | 2/2006 | Nakasuji et al. ............ 250/310 |

* cited by examiner

*Primary Examiner*—Vinh Nguyen
*Assistant Examiner*—Emily Y Chan

(57) ABSTRACT

Methods and apparatus for non-contact electrical probes are described. In accordance with the invention, non-contact electrical probes use negative or positive corona discharge. Non-contact electrical probes are suited for testing of OLED flat panel displays.

18 Claims, 3 Drawing Sheets

METHOD AND APPARATUS FOR NON-CONTACT ELECTRICAL PROBE

BACKGROUND

There are a number of techniques for measuring voltages on a flat panel display which comply with the requirement that there be no electrical contact on the active area of the flat panel display to avoid contamination of the electrode surfaces although the electrical contact may be made at the edges of the flat panel display. For example, an electron beam may be used to image the surface with voltage differences appearing as contrast differences. However, testing of the thin film circuitry for Organic Light Emitting Diode (OLED) flat panel requires measuring the current because the OLED pixel brightness is controlled using a current signal as opposed to a voltage signal used to control brightness for Liquid Crystal Display (LCD) pixel Typically, it is more difficult to measure currents. One typical technique is to incorporate an additional capacitor per pixel on the OLED display circuit and to measure the charging of this capacitor. This technique typically adds complexity to the circuit that will not be used once testing is complete. Another typical technique uses an electron beam as a non-contact probe but this technique requires placing the flat panel under test into a vacuum chamber which adds cost and time to the test procedure.

SUMMARY

In accordance with the invention, a non-contact probe permits electrical current to flow through a small gas gap to the surface of a device under test at atmospheric pressure. The non-contact probe typically includes a sharp electrode and a flat electrode where current flowing from the sharp electrode passes through a hole in the flat electrode and is captured by the device under test. The device under test is typically located beneath the aperture in the flat electrode and the voltage drop between the flat electrode and the device under test controls the current flowing to the device under test.

DETAILED DESCRIPTION OF THE INVENTION

Figure 1A:
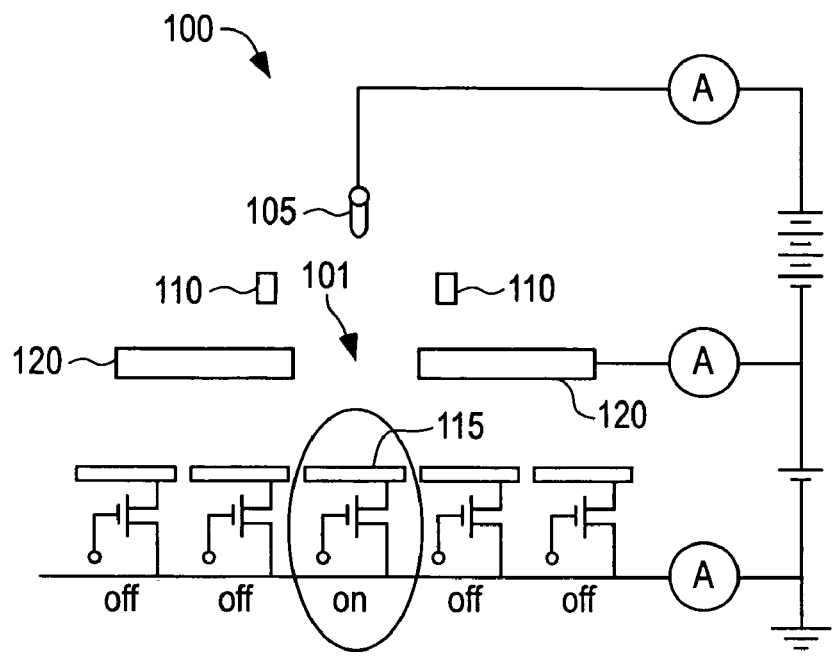
FIG. 1a shows an embodiment in accordance with the invention.
Figure 1B:
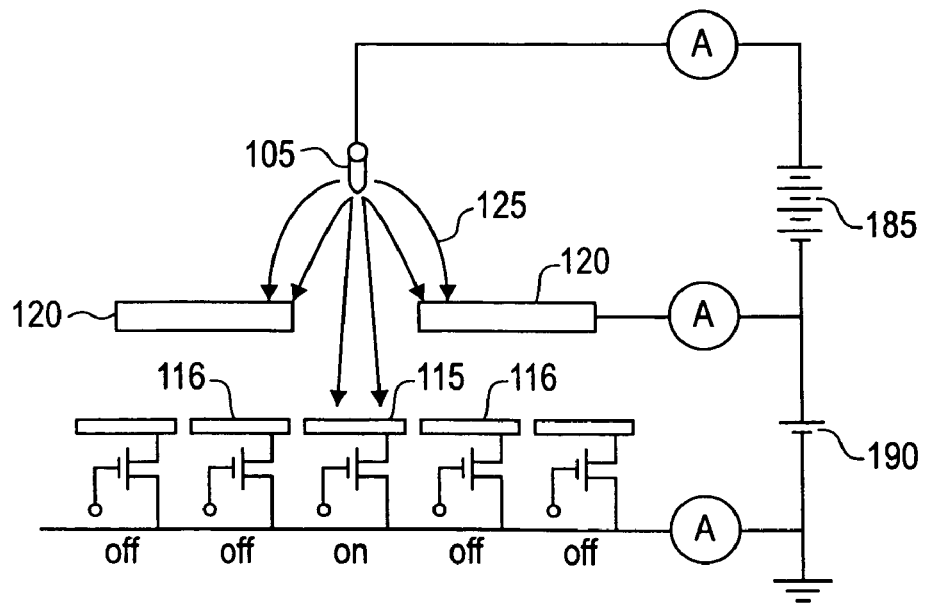
FIG. 1b shows an embodiment in accordance with the invention.
Figure 1C:
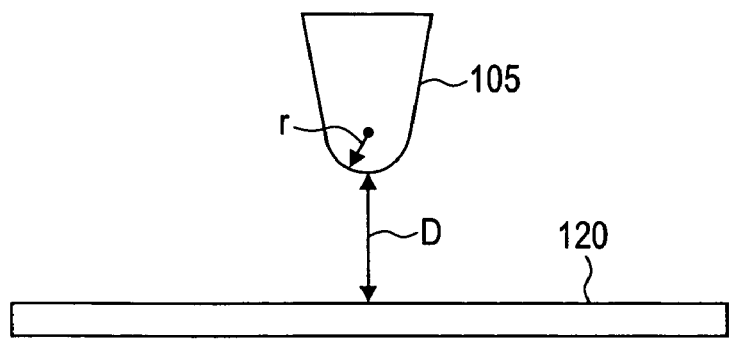
FIG. 1c shows a close up of the sharp electrode positioned with respect to the flat electrode.

FIGS. 1a and 1b show non-contact probe 100 in accordance with the invention. An atmospheric pressure plasma forms around the tip of sharp electrode 105 where the electric field is sufficiently high due to geometric effects. FIG. 1c shows sharp electrode 105 and flat electrode 120 separated by distance D, typically in the range of about 1 mm to 10 mm with the tip of sharp electrode 105 having radius of curvaturer. An electrode is "sharp" for the purposes of this application when the tip radius of curvature r of sharp electrode 105 is less than about D/5. Typical materials for sharp electrode 105 include steel, copper, platinum, nickel titanium alloy and chrome or sharp electrode 105 may be a Spindt tip, see U.S. Pat. No. 3,755,704 incorporated by reference. The high curvature ensures a high potential gradient around sharp electrode 105 for the generation of the atmospheric pressure plasma. Typical potentials for sharp electrode 105 are greater than about 1000 V. Sharp electrode 105 is typically a needle-like electrode and is typically used to test a single device or a small number of devices.

Figure 2:
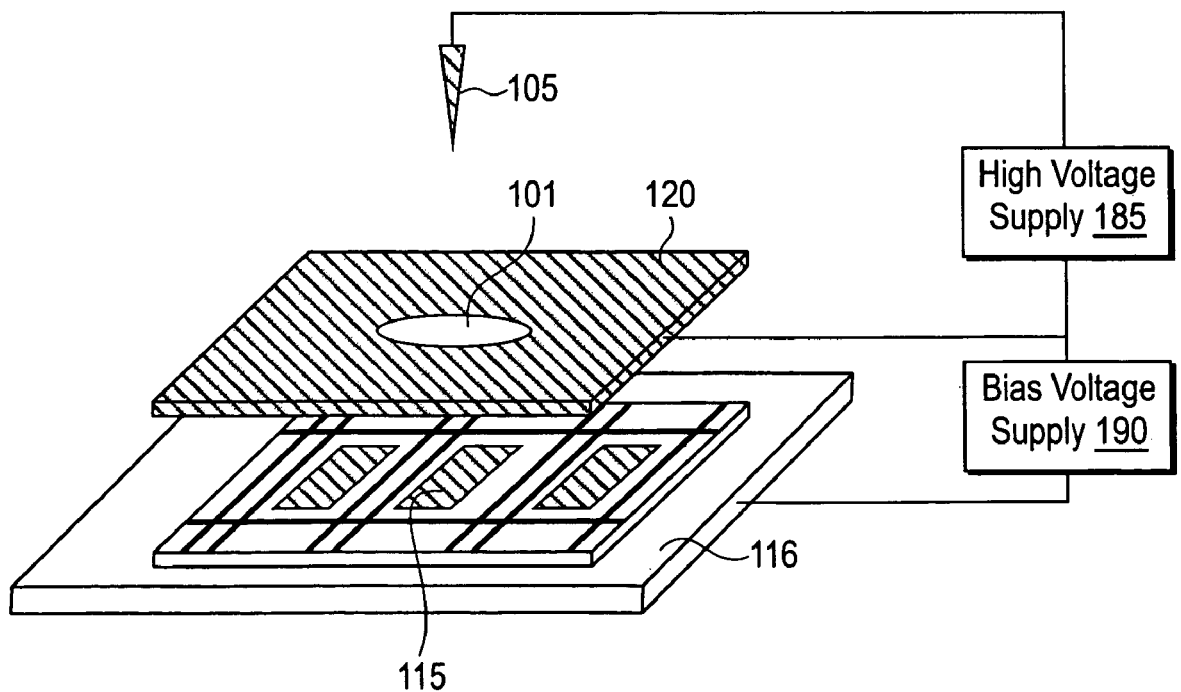
FIG. 2 shows an embodiment in accordance with the invention.

Flat electrode 120 captures most of charged species 125 that travel across the gap between sharp electrode 105 and flat electrode 120. Flat electrode 120 is typically made from a material chosen for manufacturability such as nickel, stainless steel or silicon. Aperture 101, typically about 10 μm to 300 μm in diameter, in flat electrode 120 allows a portion of charged species 125 that have traveled across the gap from sharp electrode 105 to flat electrode 120 to travel past flat electrode 120 to device under test 115. The gap between flat electrode 120 and device under test 115 is sufficiently small to ensure that the current flows to device under test 115 and not to adjacent devices 116 not under test. A typical size range for this gap is between about 0.1 mm to about 1 mm and is typically on the order of about 100 μM. Gap sizes smaller than about 100 μm are typically discouraged because the probability that contamination on flat electrode 120 may be transferred to device under test 115 is considerably increased and also contamination trapped between device under test 115 and sharp electrode 105 may cause damage to either device under test 115 or sharp electrode 105. For sharp electrode 105, aperture 101 is typically square or round in shape as shown in FIG. 2. Flat electrode 120 is typically kept at or near ground potential. The typical impedance between flat electrode 120 and device under test 115 is typically less than about 100 KΩ and no greater than about 10 MΩ.

Device under test 115 may be an electrode on the surface of an OLED flat panel display and is electrically coupled to bias voltage supply 190 using device under test interface 116 (see FIG. 2). Device under test 115 is typically biased relative to flat electrode 120 to control the amount of current, typically in the range from about 1 μA to 10 μA, flowing to the surface of device under test 115 from sharp electrode 105 as indicated in FIG. 2. Typical bias voltages are less than about 100 V. Other devices requiring contactless electrical probes may also be tested in accordance with the invention.

Steering structure 110 may be included in the gap region between sharp electrode 105 and flat electrode 120 as shown in FIG. 1 a. Steering structure 110 functions to increase the portion of charged species 125 that pass through aperture 101. Steering structure 110 may be electrostatic or electromagnetic in nature to control the path of charged species 125 from the plasma creation region to flat electrode 120. If steering structure 110 is electrostatic in nature, such as one or more metal rings kept at a fixed voltage, the electric field is typically distorted to modify the path of charged species 125. If steering structure 110 is electromagnetic in nature, such as a permanent magnet or electromagnet, the resulting magnetic field is typically used to focus charged species 125 with the resulting Lorentz force.

Figure 3:
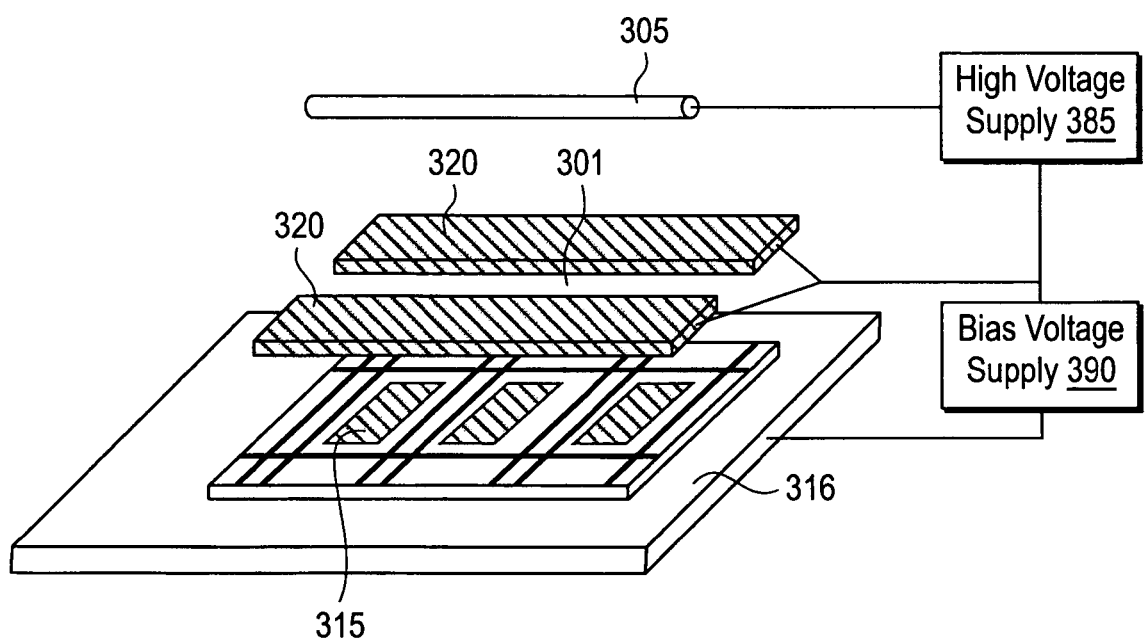
FIG. 3 shows an embodiment in accordance with the invention with a thin wire electrode.

FIG. 3 shows an embodiment in accordance with the invention where sharp electrode 105 has been replaced by thin wire electrode 305 to measure a row of devices under test 315. The radius of wire electrode 305 is typically less than 20% of the distance between wire electrode 305 and flat electrode 320. Note that aperture 101 is replaced by slit-like aperture 301 in flat electrode 320. Devices under test 315 are electrically coupled to bias voltage supply 390 using device under test interface 316. Devices under test 315 are typically biased relative to flat electrode 320 to control the amount of current, typically in the range from about 1 µA to 10 µA, flowing to the surface of device under test 315 from thin wire electrode 305 as indicated in FIG. 3. Typical bias voltages are less than about 100 V. Other devices requiring contactless electrical probes may also be tested in accordance with the invention.

With reference to FIGS. 1a–2, operationally sharp electrode 105 is biased at a high voltage, typically greater than 1000 V with respect to flat electrode 120. An atmospheric plasma is generated in the resulting large electric fields in the vicinity of sharp electrode 105. Gas, such as, for example, argon mixed with hydrogen, argon mixed with a forming gas comprised of nitrogen and hydrogen, argon mixed with oxygen or nitrogen with amounts of ammonia typically less than about one percent, is flowed past sharp electrode 105 towards device under test 115 and to provide the local atmosphere at atmospheric pressure. Argon or nitrogen alone may also be used. The gas is typically flowed from the region of sharp electrode 105 or thin wire electrode 305 through aperture 101 or aperture 301 past device under test 115 or devices under test 315, respectively. The mass flow of the gas also operates to enhance current flow through apertures 101 and 301. A negative or positive corona may be used. If a negative corona is used, electronegative species are typically only a small portion of the gas because negative ions make the plasma noisy which is typically undesirable. Note that negative coronas can only be maintained in a gas with electronegative molecules. Charged species 125 are accelerated towards flat electrode 120 while an equal number of oppositely charged species are accelerated towards sharp electrode 105 creating a current between flat electrode 120 and sharp electrode 105 through high voltage supply 185. In an embodiment in accordance with the invention, this current may be monitored and used as a feedback signal to high voltage supply 185 to reduce the current variation which results in measurement noise.

A portion of charged species 125 pass through aperture 101 in flat electrode 120. After passing through aperture 101, charged species 125 are accelerated towards device under test 115 because of the bias voltage that is maintained between flat electrode 120 and device under test 115 using bias voltage supply 190. A portion of charged species 125 that passes through aperture 101 are captured by device under test 115 and produce a current. By adjusting the bias voltage, the number of charged species 125 that are drawn through aperture 101 can typically be increased.

Similarly for the embodiment in accordance with the invention shown in FIG. 3, the charged species (not shown) pass through aperture 301 in flat electrode 320 while an equal number of oppositely charged species are accelerated towards thin wire electrode 305 creating a current between flat electrode 320 and thin wire electrode 305 through high voltage supply 385. After passing through aperture 301, the charged species are accelerated towards devices under test 315 because of the bias voltage that is maintained between flat electrode 320 and devices under test 315 using a bias voltage supply 390. A portion of the charged species that passes through aperture 301 are captured by devices under test 315 and produce a current. By adjusting the bias voltage, the number of charged species that are drawn through aperture 301 can typically be increased.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

The invention claimed is:

1. An apparatus for non-contact testing of a device under test comprising:
    an electrode comprising a radius of curvature;
    a flat electrode comprising a first face, a second face and an aperture, said first face of said flat electrode separated from said electrode by a first gap and positioned such that said aperture is aligned with said electrode and wherein a steering structure is disposed in said first gap; and
    a device under test interface is separated from said second face of said flat electrode by a second gap.

2. The apparatus of claim 1 wherein said radius of curvature is less than about one fifth of said first gap.

3. The apparatus of claim 1 wherein said electrode is comprised of nickel.

4. The apparatus of claim 1 wherein said flat electrode is comprised of stainless steel.

5. The apparatus of claim 1 wherein said electrode is a Spindt tip.

6. The apparatus of claim 1 wherein said aperture has a diameter in the range from about 10 µm to 300 µm.

7. The apparatus of claim 1 wherein said steering structure is electromagnetic.

8. The apparatus of claim 1 configured to generate a positive corona.

9. The apparatus of claim 1 wherein said electrode is a thin wire electrode.

10. The apparatus of claim 9 wherein said aperture is a slit-like aperture.

11. The apparatus of claim 1 further comprising a device under test electrically coupled to said device under test interface.

12. A method for making a non-contact testing of a device under test comprising:
    providing an electrode comprising a radius of curvature;
    positioning a flat electrode comprising a first face, a second face and an aperture such that said first face of said flat electrode is separated from said electrode by a first gap and such that said aperture is aligned with said electrode, disposing a steering structure in said first gap; and
    positioning a device under test interface such that it is separated from said second face of said flat electrode by a second gap.

13. The method of claim 12 wherein said radius of curvature is less than about one fifth of said first gap.

14. The method of claim 12 wherein said electrode is a Spindt tip.

15. The method of claim 12 wherein said steering structure is electrostatic.

16. The method of claim 12 wherein said electrode is a thin wire electrode.

17. The method of claim 12 further comprising electrically coupling a device under test to said device under test interface.

18. The method of claim 12 wherein said aperture is a slit-like aperture.

* * * * *